United States Patent [19]
Edwards et al.

[11] Patent Number: 5,550,105
[45] Date of Patent: Aug. 27, 1996

[54] SUPERCONDUCTING COMPOSITIONS

[75] Inventors: Peter P. Edwards, Solihull, Great Britain; Shu-Fen Hu; Ru-Shi Liu, both of Chutung, Taiwan; David A. Jefferson, Newmarket, Great Britain

[73] Assignee: BICC Public Limited Comapany, London, England

[21] Appl. No.: 373,223
[22] PCT Filed: Jul. 21, 1993
[86] PCT No.: PCT/GB93/01529
§ 371 Date: Jan. 31, 1995
§ 102(e) Date: Jan. 31, 1995
[87] PCT Pub. No.: WO94/02947
PCT Pub. Date: Feb. 3, 1994

[30] Foreign Application Priority Data

Jul. 23, 1992 [GB] United Kingdom .................. 9215667

[51] Int. Cl.$^6$ ............................. H01B 12/00; H01L 39/12
[52] U.S. Cl. ........................... 505/120; 505/100; 505/125; 505/778; 505/783; 505/779; 252/518; 252/521
[58] Field of Search ..................................... 252/518, 521; 505/100, 125, 778, 779, 783

[56] References Cited

FOREIGN PATENT DOCUMENTS

| | | |
|---|---|---|
| 306973A2 | 3/1989 | European Pat. Off. . |
| 306973A3 | 3/1989 | European Pat. Off. . |
| 398503A2 | 11/1990 | European Pat. Off. . |
| 411943A2 | 2/1991 | European Pat. Off. . |
| 411943A3 | 2/1991 | European Pat. Off. . |
| 475753A2 | 3/1992 | European Pat. Off. . |
| 475753A3 | 3/1992 | European Pat. Off. . |

OTHER PUBLICATIONS

Gupta et al "Mercury–Based Cuprate High–Transition Temperature Grain–Boundary Junchons . . ." Science, vol. 265, 19 Aug. 1994 pp. 1075–1077.
Adachi et al "Annealing effects on the Meissner Signals from Hg—Ba—Ca—Cu—O . . ." Physical, 214, 1993 pp. 313–315.
Supercond. Sci. Technol., vol. 5 (1992) pp. 47–49, T. P. Beales et al., "Super–conductivity at 92 in the (Pb, Cd)–1212 phase (PbO.5CdO.5)Sr2(YO.7CaO.3)Cu207—s".
Mat. Res. Bull., vol. 26 (1991) pp. 1299–1307, S. N. Putilin et al., "New Complex Copper Oxides: HgBa2RCu207 (R=La, Nd, Eu, Gd, Dy, Y)".
Letters to Nature, vol. 362, Mar. 18, 1993, pp. 226–228, S. N. Putilin et al., "Superconductivity at 94 K in HgBa2CuO4+s".
Editorial comment on Letters to Nature, vol. 362 (1993); Pick Your Poison, R. J. Cava (2 pages).
Letters to Nature, vol. 363, May 6, 1993, pp. 56–58, A. Schilling et al., "Superconductivity above 130 K in the Hg—Ba—Ca—Cu—O systems".
Chemical Abstracts, vol. 115, No. 16, Zhao et al., 21 Oct., 1991, pp. 946, abstract No. 172741b.

Primary Examiner—Paul Lieberman
Assistant Examiner—M. Kopec
Attorney, Agent, or Firm—Oliff & Berridge

[57] ABSTRACT

Superconducting compositions characterized by the formula $(Pb_aA_{1-a})(Sr_bBa_{1-b})_2(Ca_cB_{1-c})Cu_2O_7$ wherein at least half the A atoms are Hg and the remainder, if any, are selected from one or more of Cd, Tl and Cu, B is selected from Y and the rare earths, a is from 0.3 to 0.7, b is from 0 to 1 and c is from 0.2 to 0.5 are disclosed. The superconductive compositions display zero-resistance temperatures up to about 80K.

13 Claims, 6 Drawing Sheets

SUPERCONDUCTING COMPOSITIONS

This invention relates to new superconducting compositions and more particularly to superconducting ceramic compositions of the kind in which superconductivity is associated with a structure characterised by alternate layers approximating perovskite structure and rocksalt structure and having nominal compositions represented by the abbreviated formula 1-2-1-2. Representative superconductors of this kind that are now well established are (nominally)

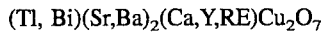

(Tl, Bi)(Sr,Ba)$_2$(Ca,Y,RE)Cu$_2$O$_7$

(Tl, Pb)(Sr,Ba)$_2$(Ca,Y,RE)Cu$_2$O$_7$ and

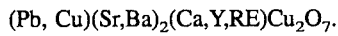

(Pb, Cu)(Sr,Ba)$_2$(Ca,Y,RE)Cu$_2$O$_7$.

The compositions containing Tl have high critical temperatures but have major toxicity hazards while the Pb/Cu ones are difficult to prepare because they are susceptible to variations in oxygen content that have major effects on properties.

Beales et al (Supercond. Sci. Technol. 5 47 (1992)) have put forward proposals to overcome these problems by using Cd-containing compositions some of which may be represented by the formula

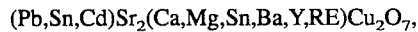

(Pb,Sn,Cd)Sr$_2$(Ca,Mg,Sn,Ba,Y,RE)Cu$_2$O$_7$, but these have semiconducting, rather than metallic, properties above the superconducting temperature range and while they have promising critical temperature onset values (around 90K) they seem to have rather broad transitions with zero-resistance temperatures as low as 45K.

Putilin et al (Mat Res Bull 26 1299–1307) report the preparation of 1-2-1-2 compositions using the metals Hg, Ba, RE, Cu, but found that they were not superconducting at any useful temperature.

We have now discovered a new group of superconducting compositions which do not necessarily require the presence of Tl and at least some of which have sharp transitions between metallic and superconductive behaviour with zero-resistance temperatures up to about 80K.

The superconductor in accordance with the invention is characterized by the formula $(Pb_aA_{1-a})(Sr_bBa_{1-b})_2(Ca_cB_{1-c})Cu_2O_7$ in which at least half the A atoms are Hg and the remainder of the A atoms, if any, are selected from one or more of Zn, Zn, Cd, Tl, Sc, Mg, Sc, Mg, and Cu; B is selected from Y and the rare earth elements; a is from 0.3 to 0.7; b is from 0 to 1 (inclusive); and c is from about 0.2 to about 0.5. The oxygen content is, as usual, nominal only.

We prefer that the A atoms do not include any Tl, and more especially that they include only Hg or Hg and one or both of Zn and Cd. Preferably B is Y.

Preferably a is in the upper part of its range, namely from 0.4 to 0.7; more especially we prefer that a is about 0.5, so that the valency of the Cu (which diminishes as Hg(II) is substituted for Pb(IV)) is about 2.1.

Preferably b is 1, that is Sr is preferred to Ba or mixtures of Sr and Ba.

The upper limit on the value of c is determined by the loss of metallic properties above the transition temperature and its lower limit by the appearance of an "impurity" phase. Preferably c is from 0.25 to 0.4, more especially about 0.3.

It will be understood that although Hg is itself toxic (as Pb is), its hazards, and the precautions to be taken to avoid or at least limit them, are much better understood than those of Tl.

The invention will be further described, by way of example, with reference to the accompanying drawings in which.

High-purity oxide powders of the stoichiometry PbO, HgO, SrO$_2$, CaO, Y$_2$O$_3$ and CuO were weighed out in four batches in proportions corresponding to the atomic ratios Pb 0.5, Hg 0.5, Sr 2, Ca 0.5, 0.6, 0.7 and 0.8, Ca+Y 1, Cu 2, mixed using a pestle and mortar and pressed into pellets with nominal dimensions of 10 mm diameter by 3 mm thick under a pressure of 5 tonne/cm$^2$. The pellets were wrapped in gold foil and enclosed in a quartz tube evacuated to about $10^{-4}$ torr. The tubes were heated at a rate of 10° C./min to 970° C., held at that temperature for 24 hours and then cooled to room temperature (about 20° C.) at a rate of 2° C./min. The heat-treated samples were black. Bars with dimensions 1.5×2×10 mm were cut from the pellets for use in resistance measurements.

Instrumentation and measurement details were as follows:

X-ray Diffraction: A Phillips PW1710 Diffractometer was used with copper K-alpha radiation.

Composition: Individual microcrystallites were examined by energy-dispersive X-ray spectrometry (EDS) using a JEM 2010 electron microscope operating at 200 kV. Molybdenum specimen grids were used and were checked to ensure freedom from residual copper signals. Nearly monophasic material of composition

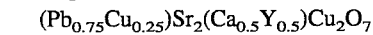

$(Pb_{0.75}Cu_{0.25})Sr_2(Ca_{0.5}Y_{0.5})Cu_2O_7$ was used as a reference material for calibration.

Electrical resistance: A standard four-point probe was applied to the samples using fine copper wires connected with a conductive silver paint and an applied current of 1 mA.

Temperature: A calibrated silicon diode sensor was located close to the sample.

Low field magnetization: Data were obtained using a superconducting quantum interference device (SQUID) magnetometer supplied by Quantum Design.

Figure 1:
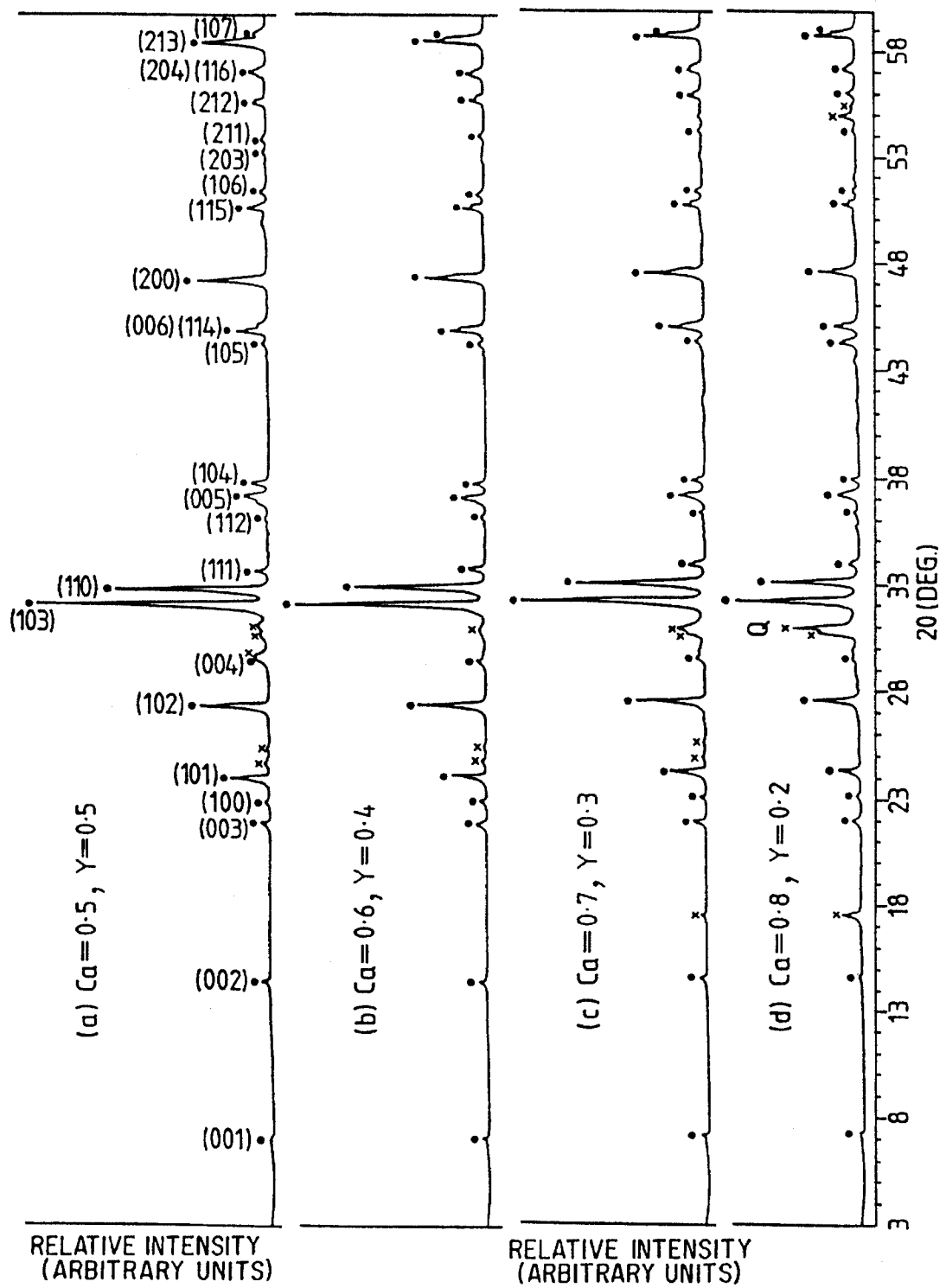
FIG. 1 is a series of X-ray diffraction patterns for four compositions in accordance with the invention.

FIG. 1 shows the powder XRD spectra of the example compositions with nominal contents of (a) Ca=0.5, Y=0.5; (b) Ca=0.6, Y=0.4; (c) Ca=0.7, Y=0.3; and (d) Ca=0.8, Y=0.2; spectrum (a) is annotated to show how it can be fitted (apart from small peaks marked "x") to a space-group P4/mmm with a tetragonal unit cell of dimensions a=3.816Å, c=11.95Å. This is closely comparable with the structure of the known similar composition with Cu in place of the Hg of the present composition: for that 2Pb/Cu composition, a=3.818 and c=11.88. We infer that the compositions are isostructural, with the increase in the c value attributable to the larger Hg$^{2+}$ ion replacing Cu$^{2+}$ in rocksalt (Pb,Cu)O layers.

Spectra (b) and (c) are extremely similar to spectrum (a), and spectrum (d) is also very similar apart from the development of a marked impurity peak Q indicating a solubility limit in the region of Ca=0.7.

Figure 2:
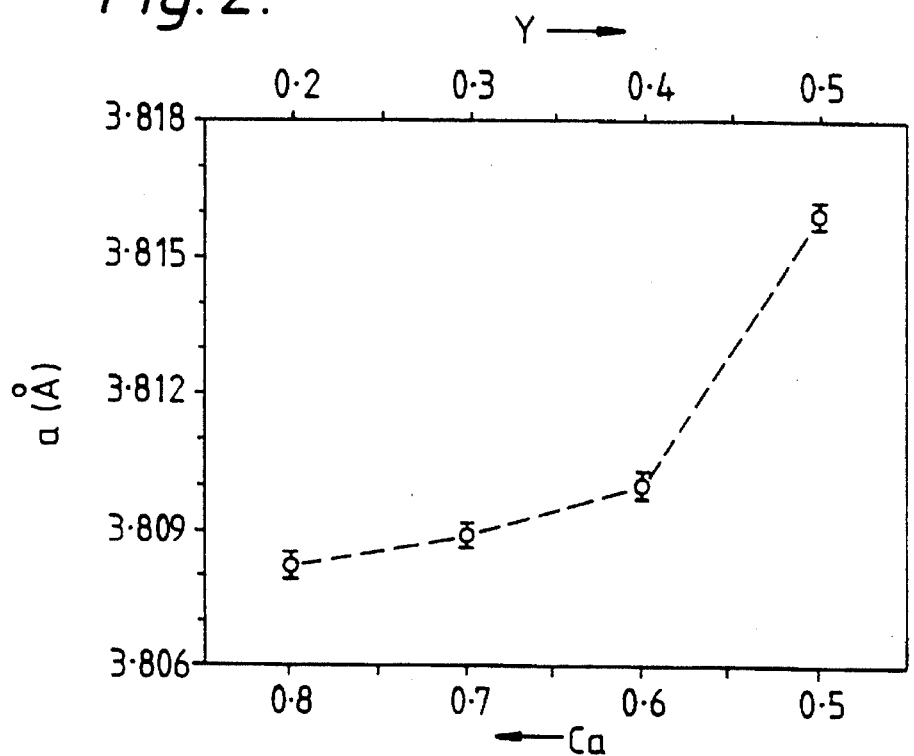
FIGS. 2 and 3 are graphs showing the variation of two crystallographic lattice constants of these example compositions with changes in Ca/Y proportions.
Figure 3:
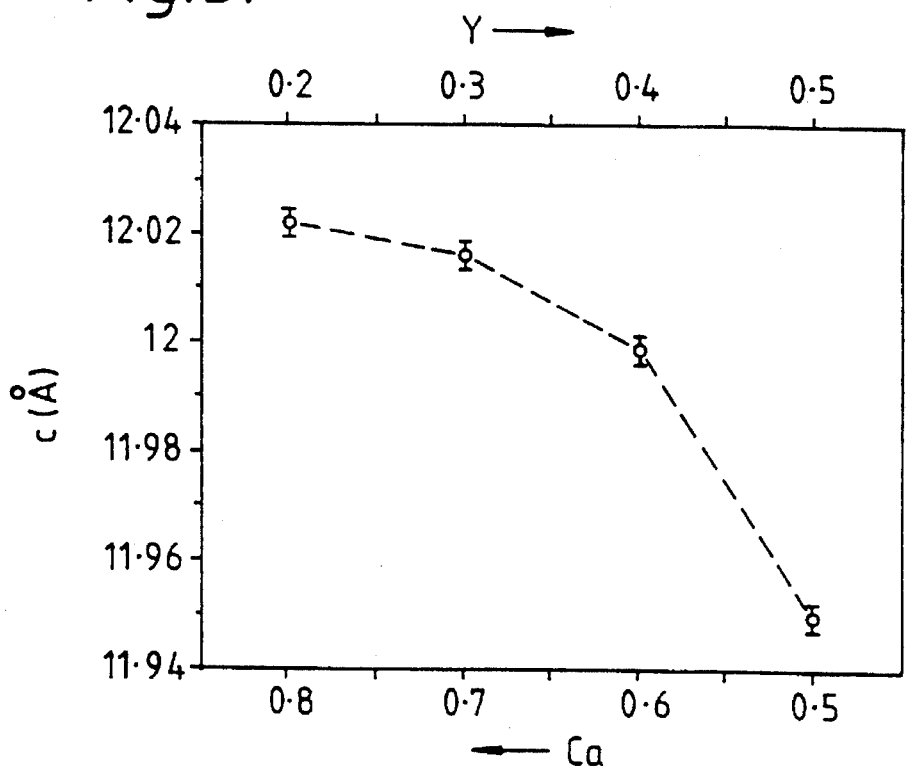

FIGS. 2 and 3 show the values of the lattice constants a and c respectively as plots against Ca/Y content. We suggest that the contraction in a as the Ca content increases may be due to the effect of substitution of $Ca^{2+}$ for $Y^{3+}$ increasing the mean Cu valency and thus reducing Cu—O bond lengths, and that the increase in c with Ca content may be due simply to the larger size of a $Ca^{2+}$ compared with $Y^{3+}$.

Figure 4A:
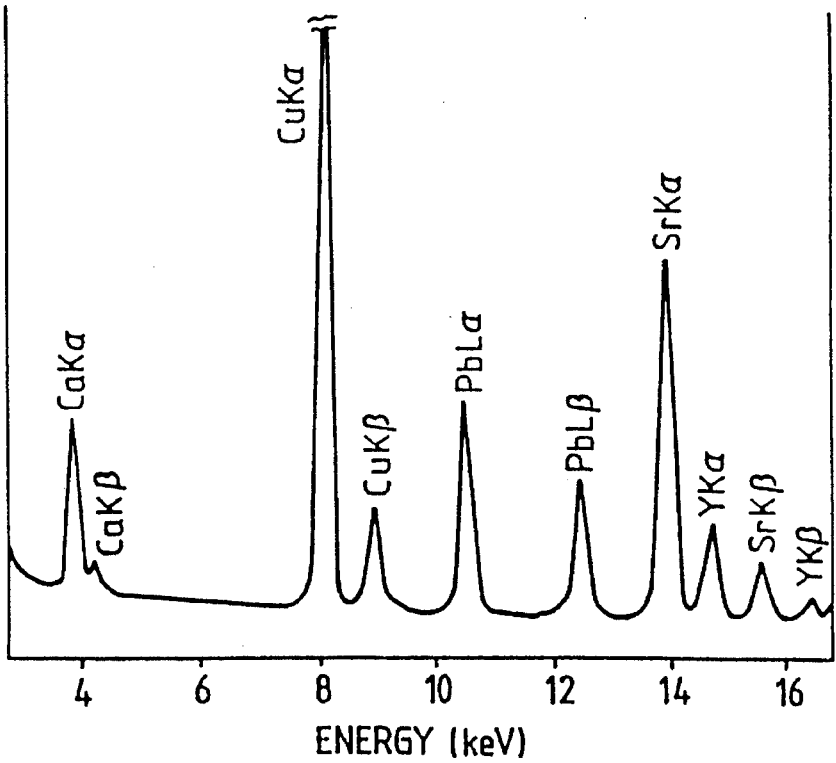
FIG. 4 is an energy-dispersive X-ray diffraction spectrum for one of the example compositions (shown with that of a known superconducting composition for comparison)
Figure 4B:
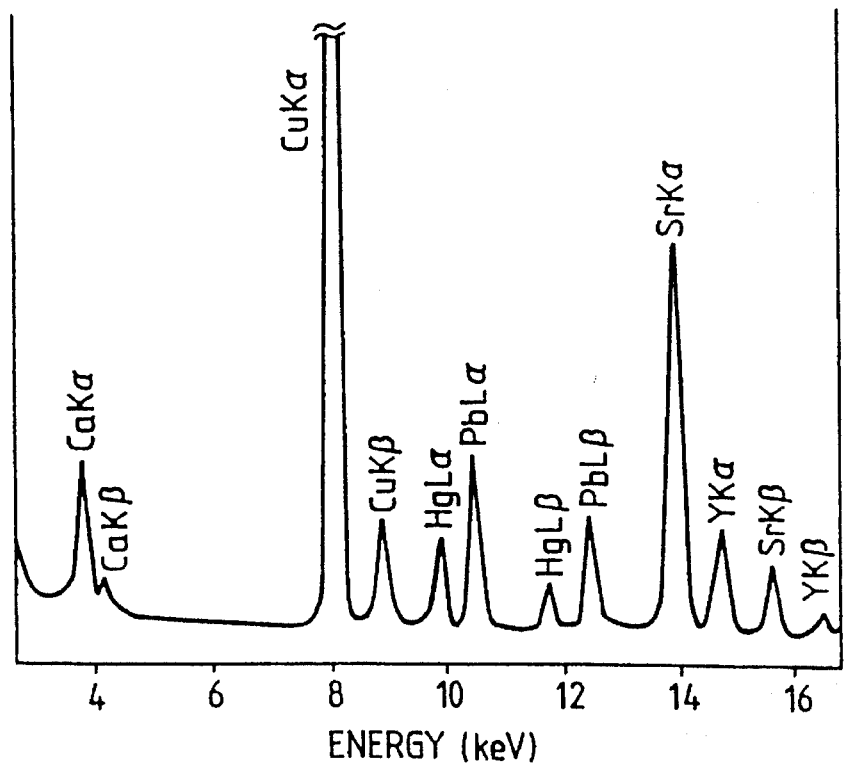

FIG. 4 shows in its lower curve the EDS spectrum of the sample with Ca=0.5, Y=0.5, and in its upper curve the corresponding spectrum for comparison of the well-characterised composition $(Pb_{0.75}Cu_{0.25})Sr_2(Ca_{0.5}Y_{0.5})Cu_2O_7$.

On the assumptions that only Sr occupies the $Sr^{2+}$ sites of the nominal structure and that the overall occupancy of the (Ca,Y) sites is unity, it can be deduced that the true composition of the sample was $(Pb_{0.67}Hg_{0.33})Sr_{2.0}(Ca_{0.52}Y_{0.48})Cu_2O_{-7}$.

Figure 5:
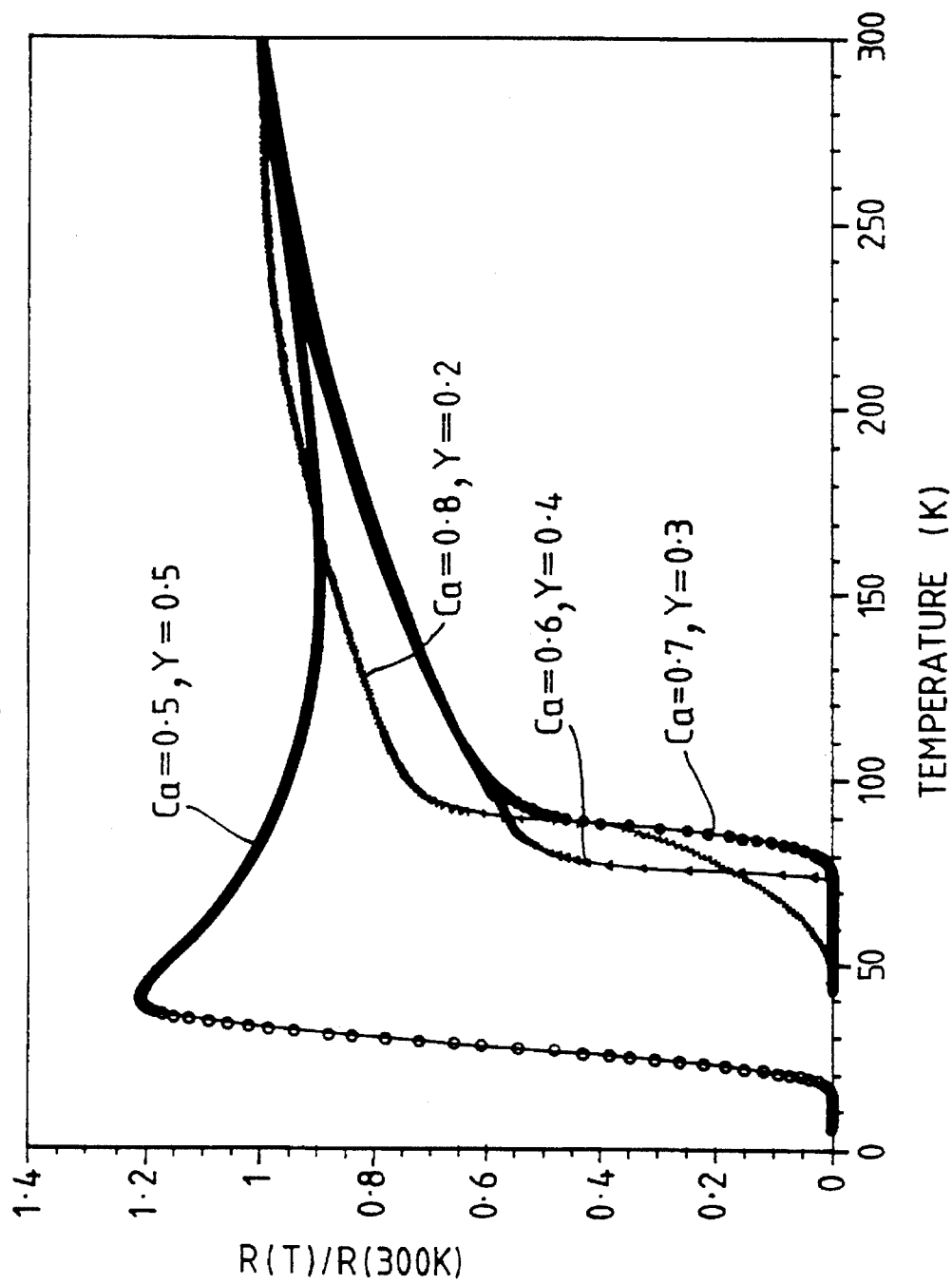
FIG. 5 is a graph showing the normalised resistance of the example compositions as a function of temperature.

FIG. 5 shows the normalised resistance (that is the resistance divided by the resistance of the same sample at 300K) as a function of temperature. It will be seen that the sample with equal numbers of Ca and Y ions has a $T_c$(onset) of about 40K, $T_c$(midpoint) about 28K and $T_c$(zero) about 14K, and has a tendency to semiconducting behaviour above $T_c$(onset); with increased Ca content, up to 0.7, values rise to $T_c$(onset) of about 100K, $T_c$(midpoint) about 90K, $T_c$(zero) about 77K; beyond Ca=0.7, the transition broadens and moves to lower temperatures. These observations can be accounted for by supposing that $Ca^{2+}$ tends to increase the hole concentration in the CuO sheets but that content above about 0.7 leads to the appearance of an impurity phase.

Figure 6:
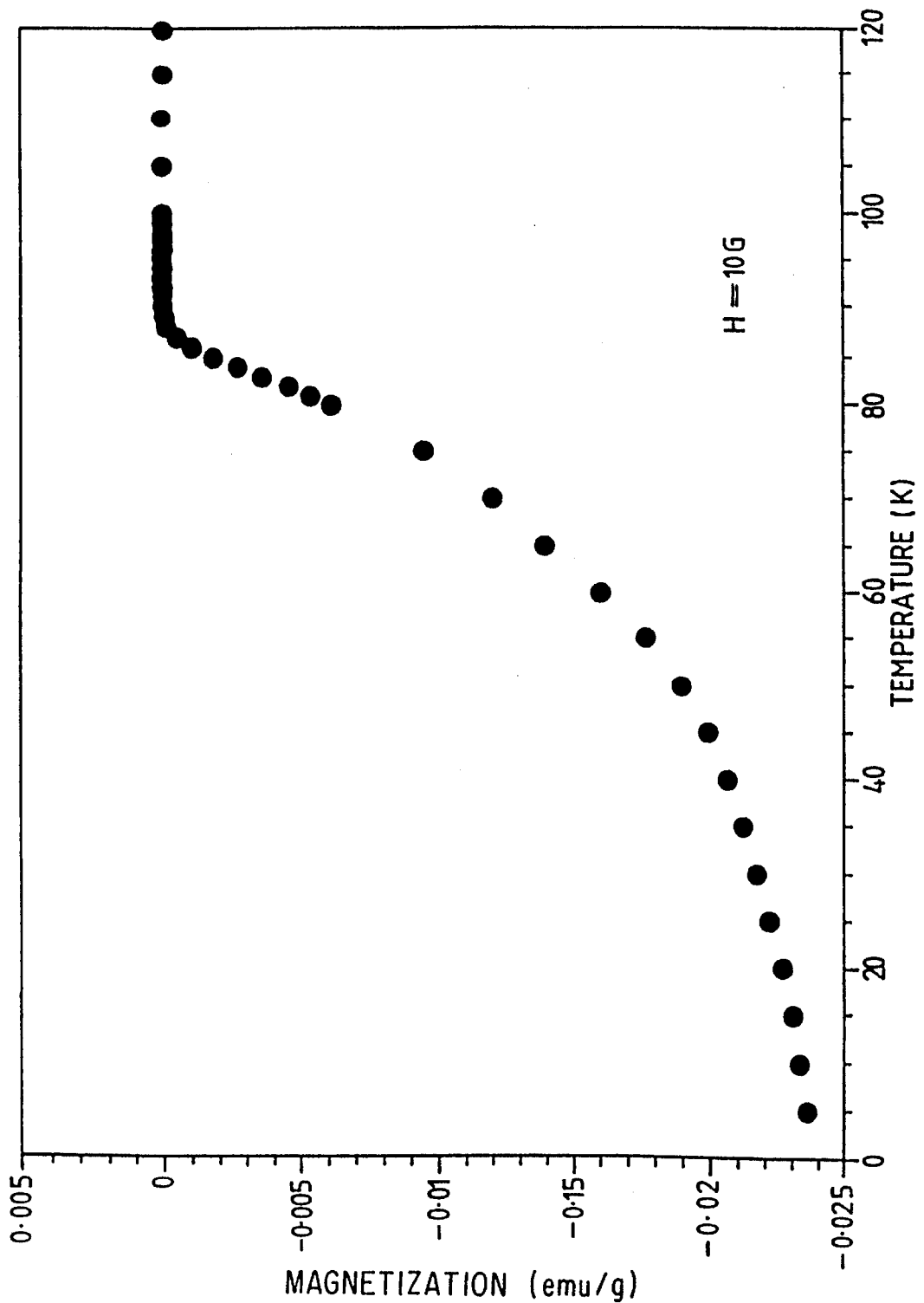
FIG. 6 is a graph of the temperature dependence of the low-field magnetization for a preferred one of the compositions.
Figure 6A:
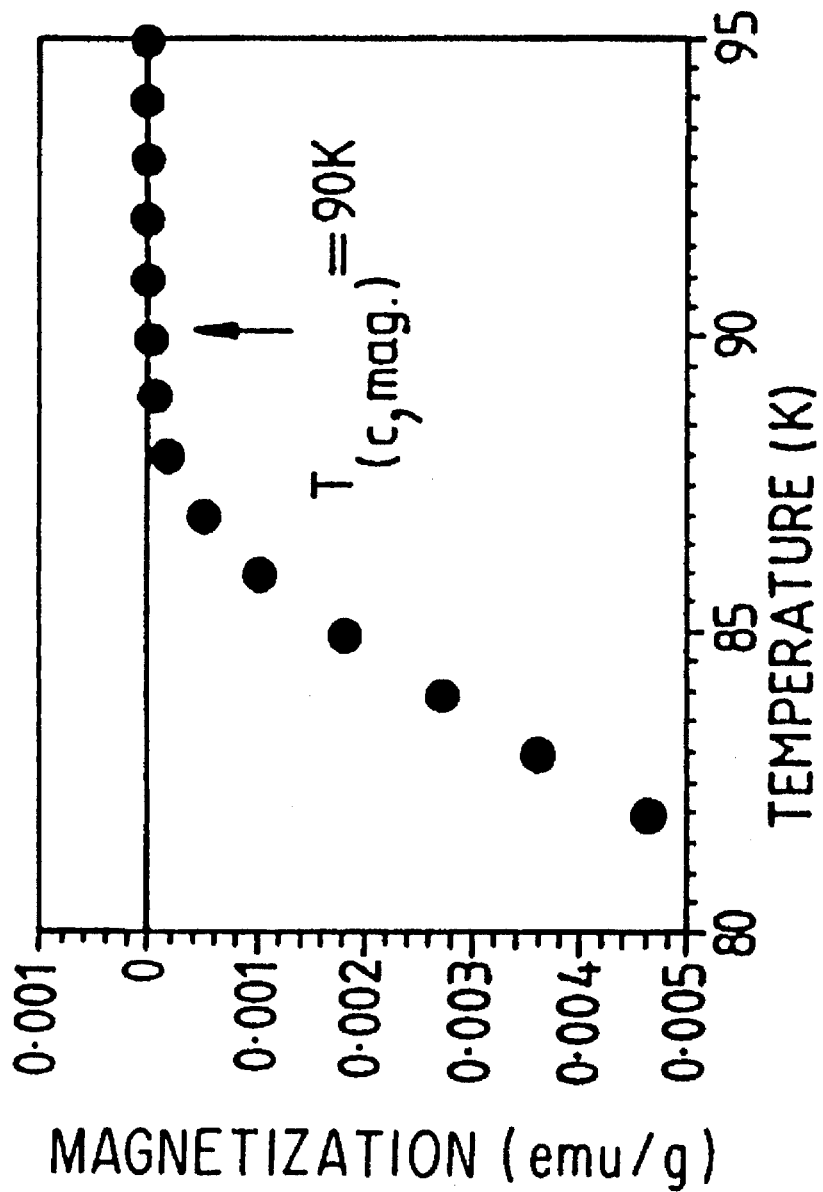

FIG. 6 shows (with a section enlarged as an inset) the temperature-dependence of the low-field magnetisation (10 Oe, field-cooled) of the example material with Ca=0.7, Y=0.3; onset diamagnetism appeared at 90K, in agreement with the electrical measurement of $T_c$(midpoint). The Meissner volume fraction was estimated as about 20% of pi over 4, which is consistent with bulk superconductivity.

We claim:

1. Superconducting ceramic compositions characterized by alternate layers approximating perovskite structure and rocksalt structure and having nominal compositions represented by the abbreviated formula 1-2-1-2 and characterized by the formula $(Pb_aA_{1-a})(Sr_bBa_{1-b})_2(Ca_cB_{1-c})Cu_2O_7$ nominal in which at least half the A atoms are Hg and the remainder, if any, are selected from one or more of Cd, Tl and Cu; B is selected from Y and the rare earth elements; a is from 0.3 to 0.7; b is from 0 to 1; and c is from 0.2 to 0.5 (all limits inclusive).

2. A superconducting composition as claimed in claim 1 in which the A atoms do not include any Tl.

3. A superconducting composition as claimed in claim 1 in which the A atoms include only Hg.

4. A superconducting composition as claimed in claim 1 in which the A atoms include only Hg and one or both of Zn and Cd.

5. A superconducting composition as claimed in claim 1 in which B is Y.

6. A superconducting composition as claimed in claim 1 in which a is from 0.4 to 0.7.

7. A superconducting composition as claimed in claim 1 in which a is about 0.5.

8. A superconducting composition as claimed in claim 1 in which the valency of the Cu is about 2.1.

9. A superconducting composition as claimed in claim 1 in which b is 1.

10. A superconducting composition as claimed in claim 1 in which c is from 0.25 to 0.4.

11. A superconducting composition as claimed in claim 1 in which c is about 0.3.

12. A superconducting composition of formula $(Pb_{0.5}Hg_{0.5})Sr_2(Ca_{0.7}Y_{0.3})Cu_2O_7$ nominal.

13. A superconducting composition of formula $(Pb_{0.67}Hg_{0.33})Sr_2(Ca_{0.52}Y_{0.48})Cu_2Y_7$ nominal.

* * * * *